US012609266B2

(12) United States Patent
Sakuta et al.

(10) Patent No.: US 12,609,266 B2
(45) Date of Patent: Apr. 21, 2026

(54) SAMPLE CARTRIDGE HOLDING APPARATUS

(71) Applicant: JEOL Ltd., Tokyo (JP)

(72) Inventors: Norimasa Sakuta, Tokyo (JP);
Tomohisa Fukuda, Tokyo (JP); **Osamu
Suzuki, Tokyo (JP); Masateru Shibata**,
Tokyo (JP)

(73) Assignee: JEOL Ltd., Tokyo (JP)

( * ) Notice: Subject to any disclaimer, the term of this
patent is extended or adjusted under 35
U.S.C. 154(b) by 641 days.

(21) Appl. No.: 18/101,182

(22) Filed: Jan. 25, 2023

(65) Prior Publication Data

US 2023/0238208 A1     Jul. 27, 2023

(30) Foreign Application Priority Data

Jan. 26, 2022     (JP) ................................. 2022-010038

(51) Int. Cl.
H01J 37/20     (2006.01)
H01J 37/28     (2006.01)

(52) U.S. Cl.
CPC .............. H01J 37/20 (2013.01); H01J 37/28
(2013.01); H01J 2237/20207 (2013.01); **H01J
2237/31749** (2013.01)

(58) Field of Classification Search
CPC .. H01J 37/20; H01J 37/28; H01J 2237/20207;
H01J 2237/31749
See application file for complete search history.

(56) References Cited

U.S. PATENT DOCUMENTS

| | | | |
|---|---|---|---|
| 6,538,254 | B1 | 3/2003 | Tomimatsu et al. |
| 2002/0050565 | A1 | 5/2002 | Tokuda et al. |
| 2014/0291511 | A1 | 10/2014 | Man et al. |
| 2018/0286628 | A1 | 10/2018 | Hasuda |

FOREIGN PATENT DOCUMENTS

| | | | | |
|---|---|---|---|---|
| DE | 2847201 | A1 | 5/1980 | |
| JP | 2002150990 | A | 5/2002 | |
| JP | 5927235 | B2 | 6/2016 | |
| JP | 2021139710 | A * | 9/2021 | .............. G01N 1/28 |
| JP | 7217298 | B2 * | 2/2023 | .............. H01J 37/20 |
| WO | 9905506 | A1 | 2/1999 | |

OTHER PUBLICATIONS

Extended European Search Report issued in EP23150602.3 on Jun.
15, 2023.

* cited by examiner

*Primary Examiner* — Uzma Alam
*Assistant Examiner* — Fani Polyzos Boosalis
(74) *Attorney, Agent, or Firm* — The Webb Law Firm

(57)     ABSTRACT

A sample cartridge has a sample stand and an inclining
mechanism. A sample cartridge holding apparatus has a
housing part which is inclined. When the sample cartridge is
inserted into the housing part, a contact portion contacts a
lever of the inclining mechanism, and the sample stand is
inclined by a predetermined angle. With this process, an
appropriate inclination angle is realized for the sample stand.

10 Claims, 12 Drawing Sheets

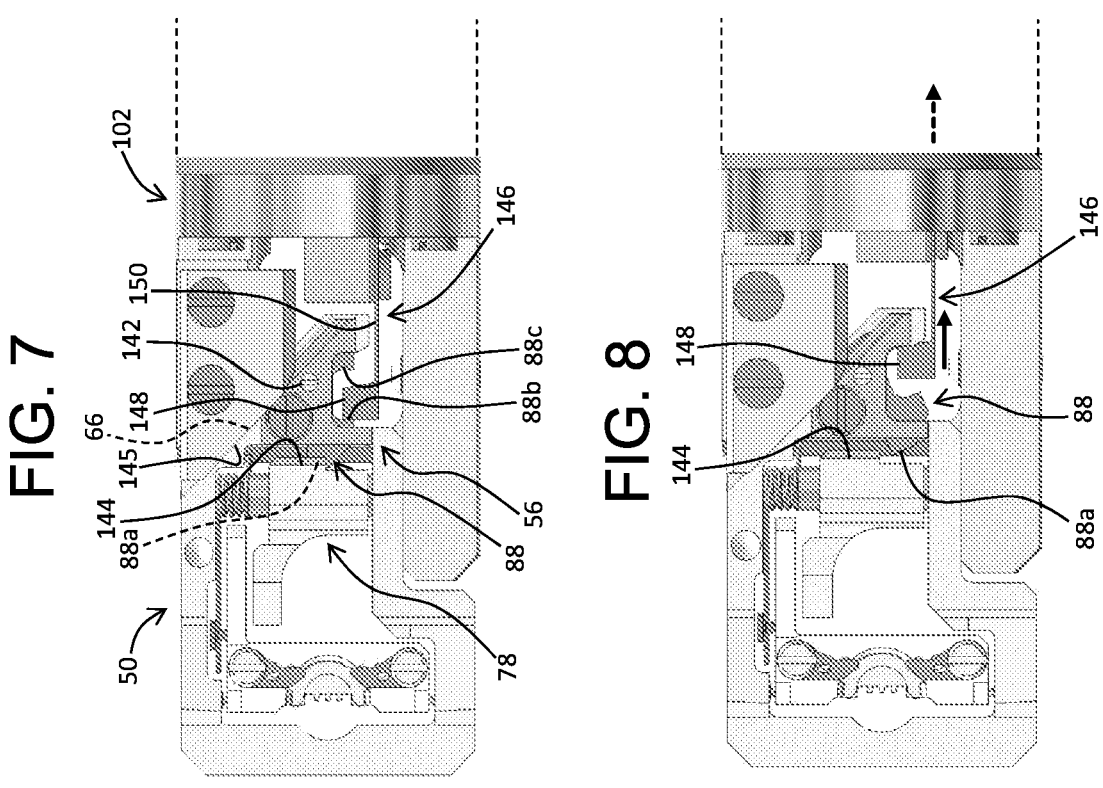

ATTACH SAMPLE CARTRIDGE ON SAMPLE CARTRIDGE HOLDING APPARATUS — S10

PROCESS AND OBSERVE SAMPLE — S12

REMOVE SAMPLE CARTRIDGE FROM SAMPLE CARTRIDGE HOLDING APPARATUS — S14

ATTACH SAMPLE CARTRIDGE ON SAMPLE CARTRIDGE HOLDER — S16

SET SAMPLE CARTRIDGE HOLDER WITH RESPECT TO TRANSMISSION ELECTRON MICROSCOPE — S18

OBSERVE SAMPLE — S20

SAMPLE CARTRIDGE HOLDING APPARATUS

CROSS REFERENCE TO RELATED APPLICATION

This application claims priority to Japanese Patent Application No. 2022-010038, filed Jan. 26, 2022, the disclosure of which is hereby incorporated by reference in its entirety.

BACKGROUND OF THE DISCLOSURE

Field of the Disclosure

The present disclosure relates to a sample cartridge holding apparatus, and in particular to a sample cartridge holding apparatus provided in a sample processing apparatus.

Description of Related Art

A sample processing apparatus is, in general, an apparatus which processes a sample using a focused ion beam (FIB). The sample processing apparatus is also called an FIB processing apparatus. A sample processing apparatus which has a scanning electron microscope (SEM) is also called a sample processing and observing apparatus or an FIB/SEM apparatus. Normally, a processed sample is observed in detail by a transmission electron microscope (TEM) (or a scanning transmission electron microscope (STEM)). WO 99/05506 and JP 2002-150990 A disclose a sample processing apparatus. These references do not describe a sample cartridge having an inclining mechanism.

In order to observe a processed sample in detail from an appropriate direction, there is desired realization of a sample cartridge which has an inclining mechanism for inclining a sample stand. When use of such a sample cartridge is considered, adaptation of the holding apparatus to the sample cartridge in the sample processing apparatus is desired.

SUMMARY OF THE DISCLOSURE

An advantage of the present disclosure lies in provision of a sample cartridge holding apparatus which holds a sample cartridge having an inclining mechanism. Alternatively, an advantage of the present disclosure lies in naturally achieving an appropriate inclination angle of a sample stand in the sample cartridge when the apparatus holds the sample cartridge having the inclining mechanism.

According to one aspect of the present disclosure, there is provided a sample cartridge holding apparatus comprising: a body having a housing part into which a sample cartridge having a sample stand and an inclining mechanism is inserted; and a contact portion that is a portion fixed on the body and that contacts a lever, provided on the inclining mechanism, during insertion of the sample cartridge into the housing part, to thereby cause a motion of the lever, wherein the inclining mechanism converts the motion of the lever into an inclining motion of the sample stand, and, in an attached state in which the insertion of the sample cartridge into the housing part is completed, an inclination angle of the sample stand in the sample cartridge is set to a predetermined angle.

BRIEF DESCRIPTION OF THE DRAWINGS

Embodiment(s) of the present disclosure will be described based on the following figures, wherein:

FIG. 7 is a plan view showing a restricted state;

FIG. 8 is a plan view showing a released state;

DESCRIPTION OF NON-LIMITING EMBODIMENTS OF THE DISCLOSURE

Figure 1:
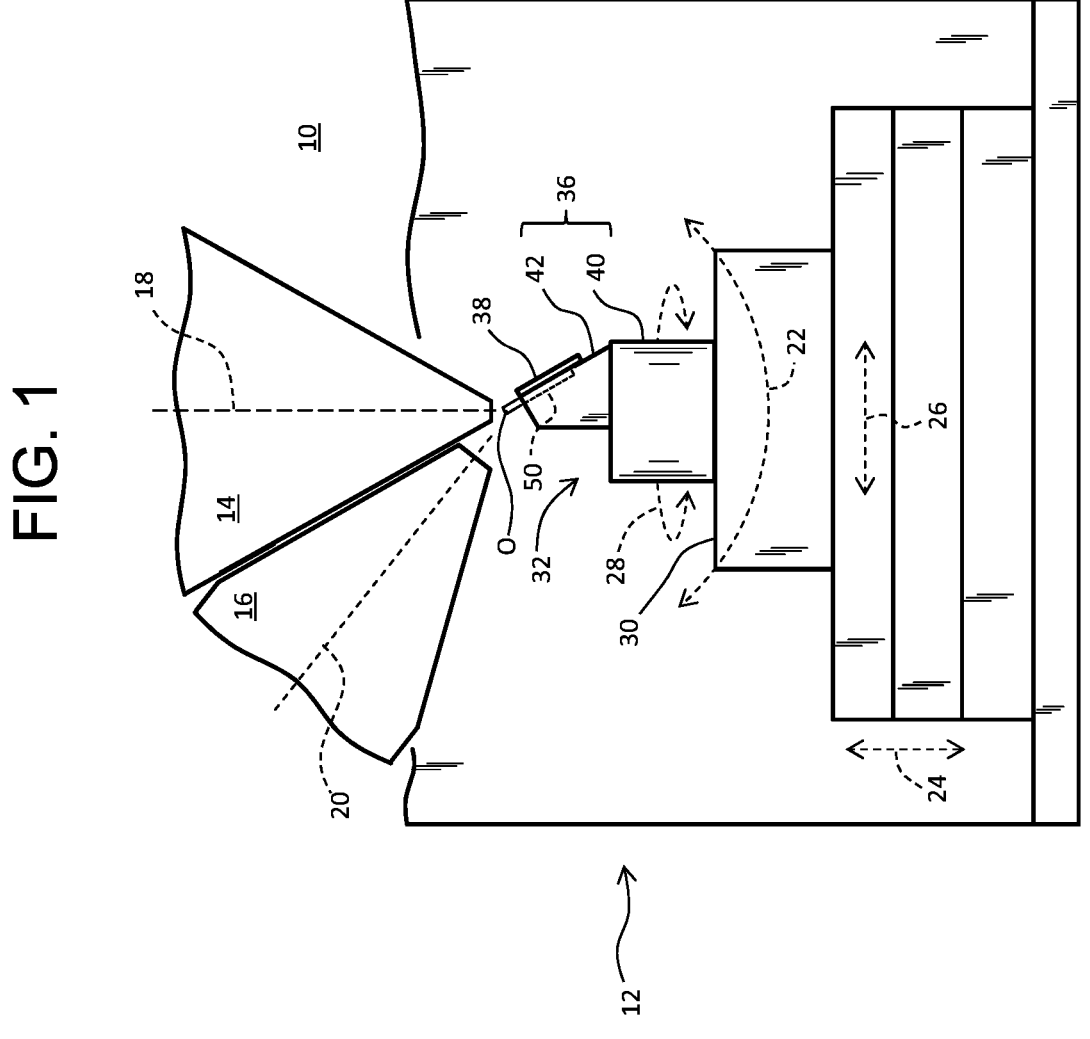
FIG. 1 is a schematic diagram showing a sample processing apparatus according to an embodiment of the present disclosure.

An embodiment of the present disclosure will now be described with reference to the drawings.

(1) Overview of Embodiment

A sample cartridge holding apparatus according to an embodiment of the present disclosure comprises a body, and a contact portion. The body includes a housing part into which a sample cartridge is inserted. The sample cartridge has a sample stand and an inclining mechanism. The contact portion is a portion fixed on the body, and contacts a lever, provided on the inclining mechanism, during insertion of the sample cartridge into the housing part, to thereby cause a motion of the lever. The inclining mechanism converts the motion of the lever into an inclining motion of the sample stand. In an attached state in which the insertion of the sample cartridge into the housing part is completed, an inclination angle of the sample stand in the sample cartridge is set to a predetermined angle.

According to the structure described above, when the sample cartridge is inserted into the housing part, the contact portion contacts the lever, and the inclining mechanism is caused to operate. With an increase in an amount of insertion of the sample cartridge, the inclination angle of the sample stand is increased. In the insertion completed state; that is, the attached state, the inclination angle of the sample stand in the sample cartridge is set to a predetermined angle (a prescribed angle for processing or observing the sample). That is, an appropriate inclination angle is realized for the sample stand.

In general, after the sample is processed, the sample cartridge is set on a transmission electron microscope, and the processed sample is observed in detail. In this process, the inclination angle of the sample stand can be changed to a desired angle using the inclining mechanism. The desired angle is an angle at which the sample is observed. In an embodiment of the present disclosure, in the sample cartridge, the sample stand is surrounded by a frame. In general, when the sample is observed in detail in the transmission electron microscope, the frame does not obstruct the observation. On the other hand, when the sample is processed or observed in the sample processing apparatus, if the sample stand is not inclined, the frame becomes an obstruction. That is, it becomes difficult to illuminate a processing beam or an observation beam onto the sample while avoiding the frame. A configuration may be considered in which a portion of the frame which becomes the obstruction is removed, but in this case, strength or rigidity of the sample cartridge is reduced. According to the structure described above, even when the sample stand is surrounded by the frame, an appropriate inclined orientation of the sample stand is naturally formed in the attached state of the sample cartridge. Thus, when the sample is processed or observed, the frame does not obstruct the processing or the observation. In other words, the predetermined angle is determined so that the frame does not obstruct the processing or the observation. A relative position of the contact portion with respect to the housing part is determined so that the predetermined angle can be realized.

According to another aspect of the present disclosure, the predetermined angle is an angle other than 0 degree and is lower than or equal to a maximum inclination angle. By adjusting the relative position of the contact portion with respect to the housing part, a desired angle may be determined as the predetermined angle. A few degrees or a few tens of degrees may be determined as the predetermined angle. The maximum inclination angle is normally a limit angle of the mechanism or a limit angle in the design.

According to another aspect of the present disclosure, the sample stand holds a support member. The support member has, for example, a plurality of protrusions. Each protrusion has a front end surface and a side end surface. Each of the front end surface and the side end surface is a surface on which the sample can be attached. In an embodiment of the present disclosure, a vector orthogonal to the front end surface is defined as a directional vector of the sample stand. In a non-inclined state of the sample stand, the directional vector coincides with or is parallel to a central axis of the sample cartridge. In an inclined state of the sample stand, the directional vector is inclined with respect to the central axis of the sample cartridge. A direction of insertion of the sample cartridge coincides with the central axis of the sample cartridge and also with a central axis of the housing part. The central axis and each of rotational axes described in the present disclosure are virtual axes.

A secondary processing may further be applied to a sample produced by a primary processing of a bulk sample. In this case, the sample after the primary processing may be attached on the support member on the sample cartridge. All of the processes including the primary processing of the sample, transfer of the sample after the primary processing, and the secondary processing of the sample may be executed on the same sample processing apparatus.

According to another aspect of the present disclosure, a z axis which is parallel to a central axis of the body, an x axis which is orthogonal to the z axis, and a y axis which is orthogonal to the z axis and the x axis are defined with the body as a reference. The housing part is inclined in the body. An inclination angle of the housing part lies in a plane defined by the z axis and the x axis, and corresponds to a rotational angle in one direction about the y axis. The inclined angle of the sample stand (predetermined angle) in the sample cartridge in the attached state lies in the above-described plane, and corresponds to a rotational direction in the other direction about the y axis. The inclination angle of the housing part in the body and the inclination angle of the sample stand in the sample cartridge are in a relationship to totally or partially cancel each other out.

According to the structure described above, in the attached state, an angle between the directional vector of the sample stand and the z axis can be set low or to zero. For example, the inclination angle of the housing part with respect to the z axis is a negative rotational angle, and the inclination angle of the sample stand (predetermined angle) in the sample cartridge in the attached state is a positive rotational angle. In an embodiment of the present disclosure, an absolute value of the predetermined angle is lower than or equal to an absolute value of the inclination angle of the housing part. In an embodiment of the present disclosure, a rotational axis of the sample stand is parallel to the y axis, and the directional vector of the sample stand is orthogonal to the y axis.

According to another aspect of the present disclosure, a cutout is formed on the body. The cutout has a front surface opening orthogonal to a direction of insertion of the sample cartridge, and a side surface opening parallel to the direction of insertion. The side surface opening is covered with a cover member, so as to form the housing part. A part of the cover member is the contact portion. In an embodiment of the present disclosure, the housing part is inclined in the body. The body has an inclined surface onto which the cover member is attached. An inclination angle of the inclined surface is equal to the inclination angle of the housing part. According to this structure, various advantages may be achieved, including ease of manufacture, simplification of the structure, and reduction of the number of components.

According to another aspect of the present disclosure, the cover member has an opening for partially exposing a portion to be housed of the sample cartridge. In an embodiment of the present disclosure, the inclining mechanism has an elastic member which exerts a rotational force in one direction on the sample stand. When the contact portion contacts the lever, the sample stand rotates in the other direction. The sample cartridge has a restriction mechanism which restricts a rotational motion of the sample stand in the one direction. The portion to be housed includes a manipulation portion for manipulating an operation of the restriction mechanism. The manipulation portion is exposed through the opening.

In the structure described above, with an action of the elastic member, the rotational force in the one direction is always exerted on the sample stand. In a state in which a pressurizing force is not exerted on the lever, the sample stand exhibits free rotational movement in the one direction. The restriction mechanism is a mechanism for preventing this rotation. For example, the non-inclined state of the sample stand is maintained by the restriction mechanism. A specific example of the restriction mechanism is a rotation-prevention mechanism to be described below. An operation state of the restriction mechanism can be checked through the opening. With this configuration, it becomes possible to avoid occurrence of a situation in which the sample stand suddenly rotates to the one direction when the sample cartridge is removed from the housing part. Alternatively, a manipulation to switch the operation state of the restriction mechanism may be performed by inserting a piece of equipment through the opening.

A sample cartridge holding apparatus according to an embodiment of the present disclosure includes a capturing mechanism that captures the sample cartridge inserted into the housing part. The capturing mechanism includes a ball which enters a recess formed on the sample cartridge, and a spring which exerts, on the ball, an elastic force toward the sample cartridge. With this structure, a stable attached state of the sample cartridge can be formed, and insertion and withdrawal of the sample cartridge can be easily performed.

A sample cartridge holding apparatus according to an embodiment of the present disclosure is mounted on a movable stage provided on an apparatus which performs processing and observation of a sample. The movable stage changes a position and an orientation of a sample by changing a position and an orientation of the sample cartridge holding apparatus.

(2) Details of Embodiment

FIG. 1 shows a sample processing apparatus according to an embodiment of the present disclosure. The sample processing apparatus is an apparatus for performing primary processing on a bulk sample (original sample), and secondary processing on a sample after the primary processing. The sample processing apparatus also has a function for observing a sample. Specifically, the sample processing apparatus is an apparatus which processes the sample using a focused ion beam (FIB), and has a scanning electron microscope (SEM).

FIG. 1 shows a sample chamber 10 in the sample processing apparatus. The sample processing apparatus has an SEM lens barrel and an FIB lens barrel. The SEM lens barrel includes an objective lens 14. The FIB lens barrel includes an objective lens 16. An optical axis 18 is an optical axis for observation, and an electron beam is illuminated along the optical axis 18. An optical axis 20 is an optical axis for processing, and a focused ion beam is illuminated along the optical axis 20. An intersection (origin) O is a point where the optical axis 18 and the optical axis 20 intersect.

A movable stage 12 is provided in the sample chamber 10. A sample cartridge holding apparatus 32 according to an embodiment of the present disclosure is mounted on the movable stage 12. The sample cartridge holding apparatus 32 is a pedestal for holding a sample cartridge 50. The sample cartridge holding apparatus 32 is formed from a body 36 and a cover member 38. The sample cartridge holding apparatus 32 will be described later in detail.

The movable stage 12 changes a position and an orientation of the sample cartridge holding apparatus 32, to thereby change a position and an orientation of a sample held on the sample cartridge 50. The movable stage 12 has a tilt mechanism, a Z slide mechanism, an X slide mechanism, a Y slide mechanism, a rotation mechanism, and the like. In FIG. 1, reference numeral 22 shows a tilt motion, reference numeral 24 shows a Z slide motion, and reference numeral 26 shows an X slide motion or a Y slide motion. Reference numeral 28 shows a rotational motion. The tilt motion 22 is a rotational motion about a tilt axis through the intersection O.

In the following, first, the sample cartridge and a sample cartridge holder will be described.

Figure 2:
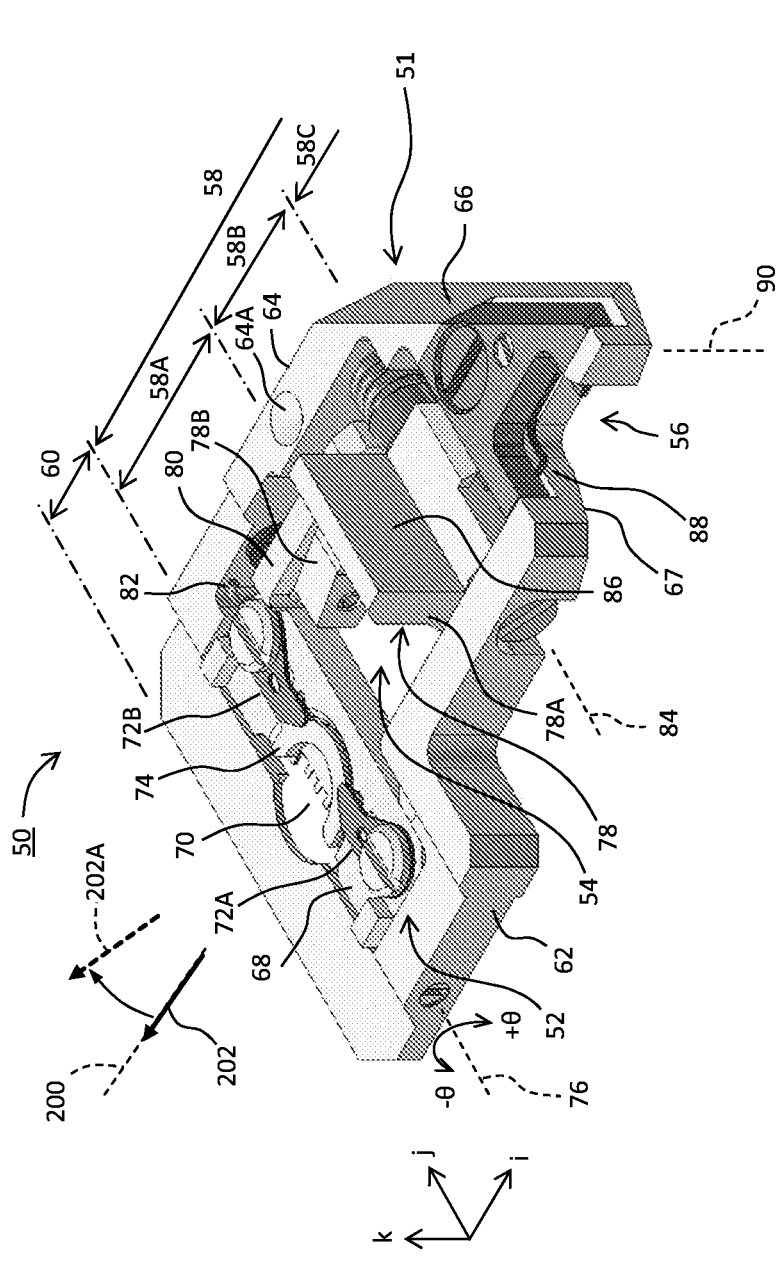
FIG. 2 is a perspective diagram showing a sample cartridge.

FIG. 2 shows the sample cartridge 50. The sample cartridge 50 has a frame 51, a sample stand 52, an inclining mechanism 54, a rotation-prevention mechanism 56, and the like. In FIG. 2, an i direction, a j direction, and a k direction which are orthogonal to each other are shown. The sample cartridge 50 has a central axis 200. The central axis 200 is parallel to the i direction.

The frame 51 has a form which extends in the i direction and the j direction, and more specifically has a form surrounding the sample stand 52. The frame 51 can be separated into a frame body 58 and a reinforcement plate 60. However, the frame body 58 and the reinforcement plate 60 are integrated, and the frame 51 is formed from a single member. The frame body 58 is formed from a front part 58A, an intermediate part 58B, and a rear part 58C. The front part A expands in the j direction, and has a wide-width form. The intermediate part 58B has a form narrowed in the j direction. The rear part 58C has an inclined surface 66 which is inclined with respect to the three directions including the i direction, the j direction, and the k direction.

From another point of view, the frame 51 has two side walls 62 and 64 and the reinforcement plate 60. The sample stand 52 and the inclining mechanism 54 are placed in a space between the two side walls 62 and 64. A cutout 67 is formed on the rear part 58C, and a part of the rotation-prevention mechanism 56 is exposed in the cutout 67. The reinforcement plate 60 has a flat plate-shape form, extending in the i direction and the j direction.

The inclining mechanism 54 is provided for changing an angle for observing the sample when detailed observation of the sample is performed using a transmission electron microscope (or a scanning transmission electron microscope). In the sample processing apparatus, when the sample stand 52 is in a non-inclined state, the reinforcement plate 60 obstructs the processing or the observation of the sample. In consideration of this, when the sample cartridge 50 is attached to the sample cartridge holding apparatus, an inclined state of the sample stand 52 is formed. This process will be described later in detail.

The sample stand 52 has a flat plate-shape form extending in the i direction and the j direction in its horizontal orientation (a state with an inclination angle of zero). The sample stand 52 detachably holds a support plate 70. As will be described below, the support plate 70 has a plurality of protrusions. Each protrusion has a front end surface and two side end surfaces, on each of which a sample can be attached. A directional vector 202 of the sample stand 52 is a vector orthogonal to the front end surface, and thus, corresponds to a line of normal of the front end surface. In order to fix the support plate 70 on the sample stand 52, springs 72A and 72B, and a spacer 74 are provided.

The sample stand 52 rotationally moves about a rotational axis 76 parallel to the j direction. In FIG. 2, a rotation in a positive direction (+θ) and a rotation in a negative direction (−θ) are shown. Signs of positive and negative showing the rotational direction are arbitrary. A maximum rotational angle in the positive direction (maximum positive inclination angle) is, for example, +30 degrees, and a maximum rotational angle in the negative direction (maximum negative inclination angle) is, for example, −30 degrees.

When the sample stand 52 is in the non-inclined state, the directional vector 202 of the sample stand 52 coincides with or is parallel to the central axis 200 of the sample cartridge 50. That is, an angle between the directional vector 202 and the central axis 200 is zero. On the other hand, when the sample stand 52 is in the inclined state, the directional vector 202A extends away from the central axis 200, and intersects the central axis 200. That is, the angle between the directional vector 202A and the central axis 200 takes a non-zero value (a positive value or a negative value).

The inclining mechanism 54 will now be specifically described. The inclining mechanism 54 is a mechanism which inclines the sample stand 52 (rotational motion). The inclining mechanism 54 includes a lever 78, an arm 80, and a torsion spring (torsion coil spring) 82. The lever 78 is a member which functions as a cam, and has a contact wall 78A and an arm 78B. A pin is provided on the arm 78B. On the other hand, the arm 80 is integrally attached to the sample stand 52. A long hole is formed on the arm 80. The long hole extends along a direction of extension of the arm 80. The pin formed on the arm 78B is inserted in a slidable manner into the long hole formed on the arm 80. The lever 78 rotationally moves about a rotational axis 84. The torsion spring 82 generates an elastic force for rotationally moving the sample stand 52 in the negative direction.

A back surface of the contact wall 78A is a contact surface 86. When a pressurizing force exceeding the elastic force of the torsion spring 82 is exerted on the contact surface 86 in the −i direction, the contact wall 78A falls toward a front side; that is, toward the side of the sample stand 52. That is, the lever 78 rotates in the negative direction about the rotational axis 84. With this process, the arm 78B moves in the downward direction in FIG. 2, and the arm 80 moves in a linked manner in the downward direction. As a result, the sample stand 52 rotates in the positive direction about the rotational axis 76. On the other hand, when the pressurizing force in the −i direction exerted on the contact surface 86 is weakened, the contact wall 78A falls toward a rear side. That is, the lever 78 rotates in the positive direction about the rotational axis 84. With this process, the arm 78B moves in the upward direction in FIG. 2, and the arm 80 moves in a linked manner in the upward direction. As a result, the sample stand 52 rotates in the negative direction about the rotational axis 76.

When the sample cartridge is attached to the sample cartridge holder for the transmission electron microscope as will be described below, a rod in the sample cartridge holder contacts the contact surface 86, and, through adjustment of an amount of stroke of the rod, the inclination angle of the sample stand 52 is changed. On the other hand, when the sample cartridge is attached to the sample cartridge holding apparatus according to an embodiment of the present disclosure, a contact portion of the sample cartridge holding apparatus contacts the contact surface 86, and presses the contact wall 78A in the −i direction by a predetermined amount. With this process, a predetermined angle is set as the inclination angle of the sample stand 52. The predetermined angle is an angle other than 0 degree, and which is lower than or equal to a maximum inclination angle. The predetermined angle is determined such that the processing and the observation of the sample can be appropriately performed in the sample processing apparatus.

When the contact of the rod or the contact portion with respect to the contact surface 86 disappears, the sample stand 52 freely rotationally moves in the −θ direction due to an action of the torsion spring 82. In some cases, problems such as dropping or damaging of the sample may occur. In order to prevent such problems, the rotation-prevention mechanism 56 is provided as a restriction mechanism.

The rotation-prevention mechanism 56 has a rotation plate 88. The rotation plate 88 is a member which rotates about a rotational axis 90 parallel to the k axis. The rotation plate 88 has a flat plate-shape form extending in the i direction and the j direction. When the rotation plate 88 rotates in one direction and an acting end of the rotation plate 88 is inserted into a lower side of a protrusion (or a jaw) protruding from a rear side of the lever 78, the rotational motion in the positive direction of the lever 78 about the rotational axis 84 (rotational motion to the side of the rear part 58C) is restricted. In the restricted state, the rotational angle of the sample stand 52 is maintained at 0 degree. However, the rotational motion in the negative direction of the lever 78 about the rotational axis 84 is permitted. Therefore, when the sample cartridge is attached to the sample cartridge holding apparatus, even if the rotation-prevention mechanism 56 is in an acting state, the inclination angle of the sample stand 52 can be set to the predetermined angle. On the other hand, when the rotation plate 88 rotates in the other direction and the acting end of the rotation plate 88 is detached from the lower side of the protrusion of the lever 78, the restriction of the rotational motion in the positive direction of the lever 78 is released, and the rotational motion in the positive direction of the lever 78 is permitted.

A recess 64A is formed on the side wall 64. The recess 64A forms one element of a capturing mechanism. The capturing mechanism will be described later.

Figure 3:
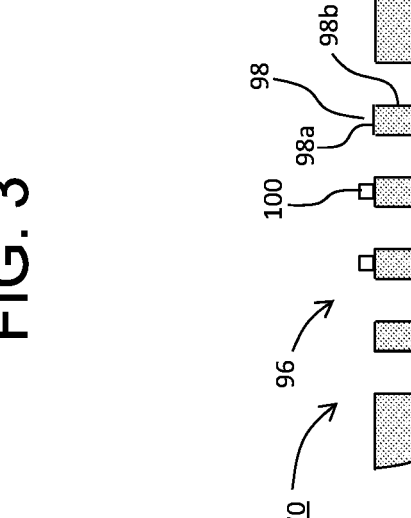
FIG. 3 is a schematic diagram showing an example of a support plate.

FIG. 3 shows an example of the support plate 70. The support plate 70 is a semicircular member extending in a p direction and a q direction. The support plate 70 is formed from a body 94 and a protrusion array 96. The protrusion array 96 is formed from a plurality of protrusions 98 arranged in the p direction. Each protrusion 98 protrudes from the body 94 in the q direction. Each protrusion 98 has a front end surface 98a and two side end surfaces 98b. One or a plurality of samples 100 is/are attached with respect to the front end surface 98a or the side end surface 98b which is selected (in FIG. 3, the sample 100 is represented in an exaggerated manner). Each front end surface 98a is orthogonal to the q direction. Each side end surface 98b is orthogonal to the p direction. The q direction corresponds to or is parallel to the directional vector of the sample stand.

Figure 4:
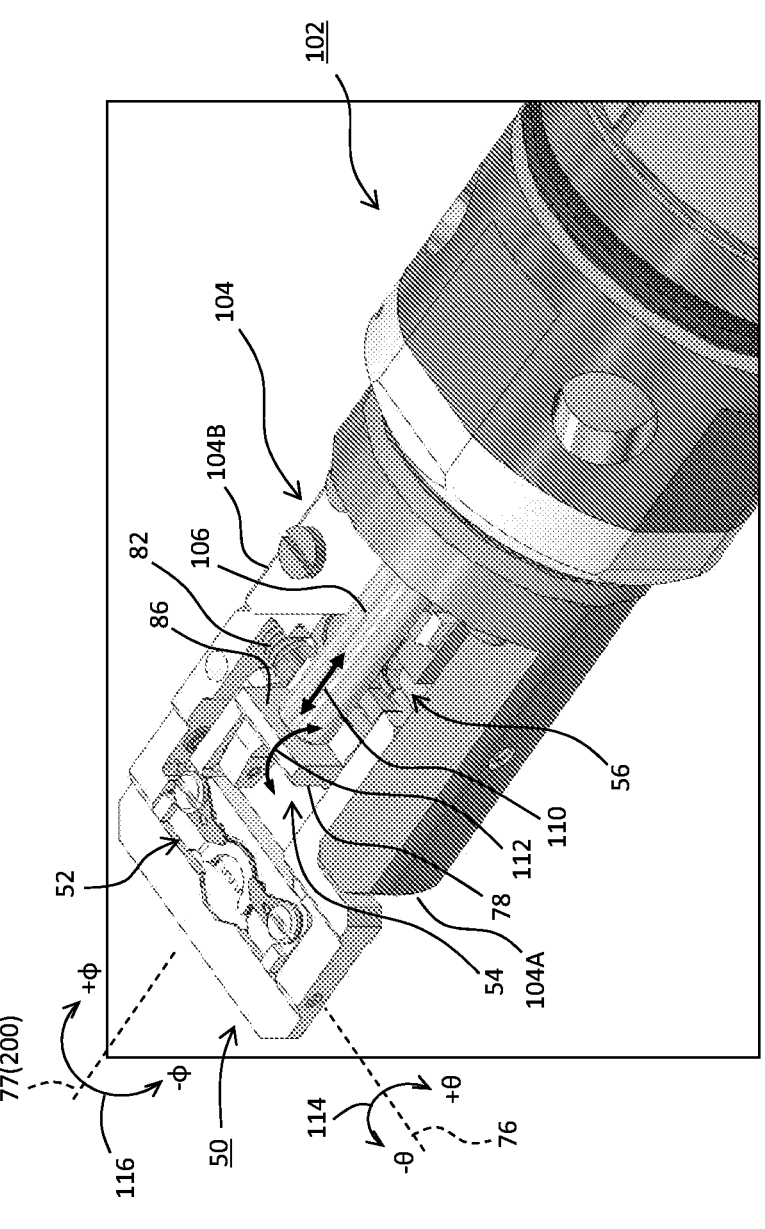
FIG. 4 is a perspective diagram showing a sample cartridge holder equipped on a transmission electron microscope.

FIG. 4 shows a tip part of a sample cartridge holder 102. The sample cartridge holder 102 is a piece of equipment used when the sample cartridge 50 is placed in the transmission electron microscope, and is attached to the transmission electron microscope. As the transmission electron microscope, the scanning transmission electron microscope may be employed. The sample cartridge holder 102 has an attachment structure 104. The sample cartridge 50 is attached to the attachment structure 104.

The attachment structure 104 has an attachment surface, a side wall 104A, an inclined wall 104B, and the like. A lower surface of the sample cartridge 50 is mated with the attachment surface. The inclined surface 104B has an opposing inclined surface which mates with the inclined surface provided on the sample cartridge 50. During insertion of the sample cartridge 50 into the attachment structure 104, the inclined surface and the opposing inclined surface mate with each other, the inclined surface is guided by the opposing inclined surface, and the sample cartridge 50 is positioned at a predetermined position on the attachment structure 104. In this state, the sample cartridge 50 is captured by the capturing mechanism provided on the sample cartridge holder 102. Normally, the acting state of the rotation-prevention mechanism 56 is released when the sample cartridge 50 is attached.

The sample cartridge holder 102 has a rod 106 which slides. A tip part of the rod 106 is in contact with the contact surface 82 of the lever 78, so as to restrict the rotation in the positive direction of the lever 78. When the rod 106 is moved forward, the lever 78 rotationally moves in the negative direction, and, with a conversion action of the inclining mechanism 54, the sample stand 52 rotates in the positive direction about the rotational axis 76. On the other hand, when the rod 106 is moved rearward, the lever 78 rotationally moves in the positive direction due to the elastic force of the torsion spring 82, and, through the conversion action of the inclining mechanism 54, the sample stand 52 rotates in the negative direction about the rotational axis 76. Reference numeral 110 shows a slide motion of the rod 106. Reference numeral 112 shows a rotational motion of the lever 78. Reference numeral 114 shows a rotational motion of the sample stand 52.

The sample cartridge holder 102 can be rotationally moved about a rotational axis 77 provided on the sample cartridge holder 102. A rotational motion in the positive direction is shown with +φ, and a rotational motion in the negative direction is shown with −φ. The rotational axis 77 coincides with the central axis 200 of the sample cartridge holder 102.

Figures 5, 6:
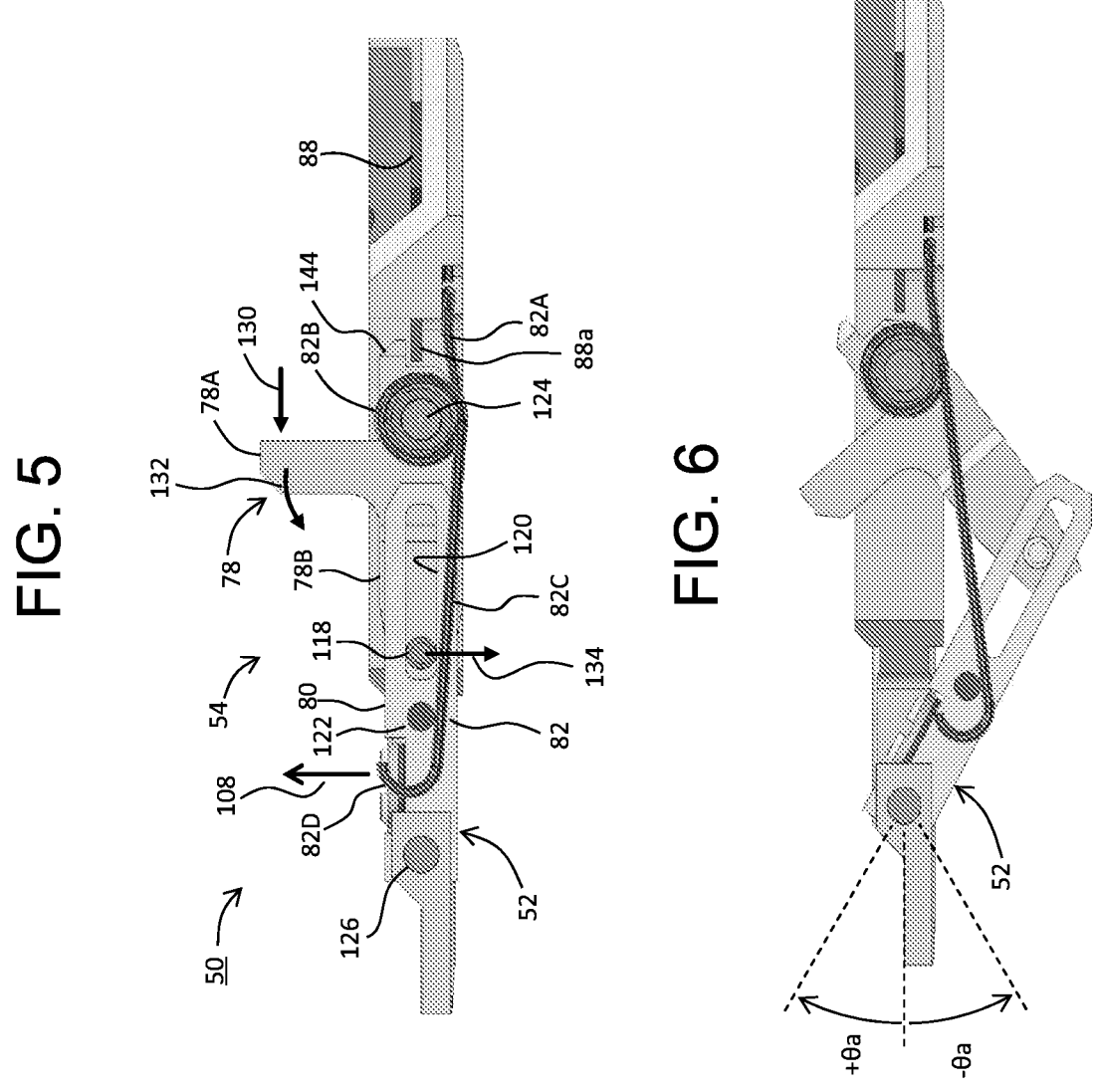
FIG. 5 is a cross-sectional diagram showing a horizontal state of a sample stand.
FIG. 6 is a cross-sectional diagram showing an inclined state of a sample stand.

FIG. 5 shows a horizontal state of the sample stand 52, and FIG. 6 shows an inclined state of the sample stand 52. In FIG. 5, the rotation restriction by the rotation-prevention mechanism is released. That is, an acting end 88a of the rotation plate 88 is detached from the lower side of a protrusion 144 provided on the lever 78. In this state, the rotational motions in the positive direction and the negative direction of the sample stand 52 are permitted.

The torsion spring 82 has a base part 82A, a coil part 82B, an intermediate part 82C, and a tip part 82D. The tip part 82D exerts the elastic force on a pin 122 provided on the arm 80. An arrow 108 shows a direction of exertion of the elastic force. A pin 118 is provided on the arm 78B, and a long hole 120 is formed on the arm 80. The pin 118 is inserted into the long hole 120. A shaft member 124 is provided along the rotational axis of the lever 78, and a shaft member 126 is provided along the rotational axis of the sample stand 52.

When, for example, a pressurizing force is exerted toward a left side in the figure on the contact wall 78A as shown by an arrow 130, the lever 78 rotates as shown by an arrow 132, and the arm 78B is inclined in the downward direction. In this process, as shown by an arrow 134, the pin 118 provided on the arm 78B presses the arm 80 downward, and the arm 80 is inclined toward the downward direction.

As a result, for example, a state as shown in FIG. 6 is formed. The sample stand 52 is rotationally moved in the positive direction, and the inclined state of the sample stand 52 is thus formed. A value +θa shows a maximum rotational angle in the positive direction (maximum positive inclination angle) of the sample stand 52. A value −θb shows a maximum rotational angle in the negative direction (maximum negative inclination angle) of the sample stand 52. The value +θa is, for example, +30 degrees, and the value −θb is, for example, −30 degrees.

The acting state and the released state of the rotation-prevention mechanism will now be described with reference to FIGS. 7 and 8. In FIG. 7, the sample cartridge 50 is attached to the sample cartridge holder 102. The inclined surface 66 provided on the sample cartridge 50 is mated with an opposing inclined surface 145 provided on the sample cartridge holder 102. The sample cartridge holder 102 has a manipulation member 146 which moves in a sliding manner. The manipulation member 146 has a shaft 150 and a head 148. The rotation plate 88 has the acting end 88a, a first edge 88b, and a second edge 88c.

When the manipulation member 146 is moved forward, the head 148 presses the first edge 88b, and, as a consequence, the rotation plate 88 rotates in the positive direction (clockwise direction in FIG. 7). With this movement, the acting end 88a enters the lower side of the protrusion 144.

The acting end 88a restricts the movement of the protrusion 144 in the downward direction, so as to restrict the rotational motion of the lever 78 in the positive direction. Although the rotational motion of the lever 78 in the negative direction is permitted, because the elastic force of the torsion spring (rotational force in the positive direction) is exerted on the lever 78 at all times, the rotational motion of the lever in the negative direction does not occur naturally. Thus, the horizontal orientation of the sample stand is maintained.

When the manipulation member 146 is moved rearward as shown in FIG. 8, the head 148 presses the second edge, and, as a consequence, the rotation plate 88 rotates in the negative direction (counterclockwise direction in FIG. 7). With this process, the acting end 88a is detached from the lower side of the protrusion 144. In this state, the rotational motions of the sample stand in the positive and negative directions are permitted.

Next, with reference to FIGS. 9 to 15, the sample cartridge holding apparatus according to an embodiment of the present disclosure will be described in detail. As already described above, the sample cartridge holding apparatus is mounted on the movable stage of the sample processing apparatus.

Figure 9:
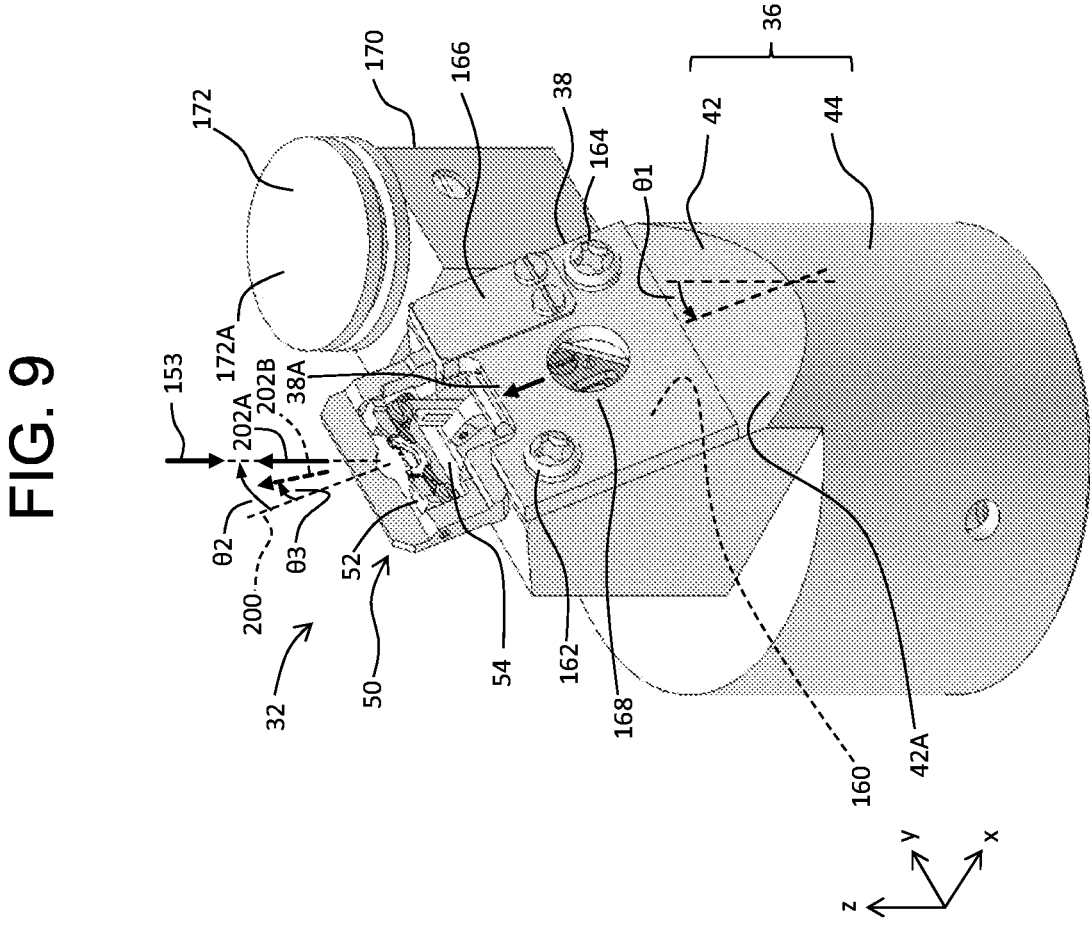
FIG. 9 is a perspective diagram showing a sample cartridge holding apparatus according to an embodiment of the present disclosure.

As shown in FIG. 9, the sample cartridge holding apparatus 32 is formed from the body 36 and the cover member 38. FIG. 9 shows an orthogonal coordinate system defined with the body 36 as a reference. More specifically, an x axis, a y axis, and a z axis are shown. The z axis is parallel to the central axis of the body 36.

The body 36 is formed from, for example, a metal such as aluminum, and is formed form an upper part 42 and a lower part 44. The lower part 44 functions as a base, and has a circular cylindrical form. On the upper part 42, a housing part 160 is formed which houses the sample cartridge 50. The housing part 160 is inclined with respect to the z axis. Specifically, a central axis of the housing part 160 is inclined with respect to the z axis with an inclination angle of θ1. The angle θ1 is, for example, −30 degrees. When the sample cartridge 50 is inserted into the housing part 160, the central axis 200 of the sample cartridge 50 coincides with the central axis of the housing part 160, and a direction of insertion of the sample cartridge 50 coincides with the central axis 200 of the sample cartridge 50.

The upper part 42 has an attachment surface 42A, which is also inclined with respect to the z axis. The inclination angle of the attachment surface 42A is also θ1. On the attachment surface 42A, the cover member 38 is attached. The cover member 38 is formed from, for example, a metal such as copper. A cutout having an inlet opening and a side surface opening is formed on the upper part 42, and the side surface opening is covered with the cover member 38. With this configuration, the housing part is formed to have a slit shape or a well shape housing part 160. The sample cartridge 50 is inserted through the inlet opening into the housing part 160. The cover member 38 is fixed on the upper part 42 with two screws 162 and 164.

The cover member 38 has a cutout, and a bottom of the cutout functions as a contact portion 38A. That is, during insertion of the sample cartridge 50 into the housing part 160, the contact portion 38A contacts the lever provided on the inclining mechanism 54, causing a rotational motion of the lever. With this rotational motion, the sample stand 52 rotationally moves in the positive direction by a predetermined angle. As a result, the inclined state of the sample stand 52 is formed.

The predetermined angle described above is an angle of the directional vector 202A of the sample stand 52 with respect to the central axis 200 of the sample cartridge 50 in the attached state of the sample cartridge 50. In the illustrated example structure, the predetermined angle is determined such that the directional vector 202A is parallel to the z axis (refer to θ2 in FIG. 9). The angle θ1 corresponds to a negative rotational angle about the y axis, and the predetermined angle corresponds to a positive rotational angle about the y axis. Alternatively, the angle θ1 may be understood as corresponding to the positive rotational angle about the y axis, and the predetermined angle may be understood as corresponding to the negative rotational angle about the y axis. In either case, in the attached state of the sample cartridge 50, the inclination angle θ1 of the housing part 160 in the body 36 and the inclination angle (predetermined angle) of the sample stand 52 in the sample cartridge 50 are in a relationship to totally or partially cancel each other out.

Alternatively, as the predetermined angle, an angle θ3 smaller than the angle θ2 may be employed. The directional vector of the sample stand 52 when the angle θ3 is employed as the predetermined angle is shown by reference numeral 202B. As already described, the predetermined angle is an angle other than 0 degree, and which is lower than the maximum inclination angle. The predetermined angle may be set to a few degrees (for example, 3 or 4 degrees), or to a few tens of degrees (for example, 20 or 30 degrees). The maximum inclination angle may be set to 40, 50, or 60 degrees, for example. The numerical values described in the present disclosure are merely exemplary.

More specifically, the inclination angle of the housing part 160 is in an xz plane defined by the x axis and the z axis, and corresponds to a rotational angle in one direction about the y axis. The inclination angle of the sample stand 52 in the attached state; that is, the predetermined angle, is in the xz plane, and corresponds to a rotational angle in the other direction about the y axis. The predetermined angle is determined such that the frame (in particular, the reinforcement plate) of the sample cartridge 50 does not interfere with the processing beam and the observation beam during the processing and the observation of the sample.

In the illustrated example structure, the angle θ1 is −30 degrees, and the angle θ2 is +30 degrees. That is, the predetermined angle is +30 degrees. In this configuration, when the movable stage is in an original state, the front end surface of the support plate is orthogonal to an electron beam 153 for observation. Such a configuration is merely exemplary. As already described, other inclination angles may be employed as the predetermined angle in view of processing and observation or in consideration of the other structures in the sample chamber. An alternative configuration may be considered, for example, in which the predetermined angle is a negative angle.

The sample cartridge holding apparatus 32 has a capturing mechanism. The capturing mechanism has a leaf spring 166 fixed on the cover member 38. The capturing mechanism will be described later.

The cover member 38 has a circular opening 168. The opening 168 exposes a part of the rotation-prevention mechanism, and more specifically exposes the first edge and the second edge described above. The acting state and the non-acting state of the rotation-prevention mechanism can be identified based on the states (amounts of protrusion) of the first edge and the second edge. Prior to detachment of the sample cartridge 60, the state of the rotation-prevention mechanism is checked through the opening 168. When the rotation-prevention mechanism is in the non-acting state, a tool or the like is inserted through the opening 168, and the first edge is pressed, to thereby form the acting state of the rotation-prevention mechanism. Then, the sample cartridge 50 is withdrawn from the housing part 160.

A pedestal 170 is fixed on the body 36. A table 172 is provided on the pedestal 170. The table 172 is, for example, a pin stub. A height of the table 172 (position in the z direction) can be changed. A bulk sample which is an original sample is mounted on a mounting surface 172A of the table 172. A primary processing is performed on the bulk sample. The sample after the primary processing is transferred using a probe or the like to the support plate held on the sample cartridge 50. That is, the sample is attached on a particular front end surface or a particular side end surface of the support plate. All of the primary processing, the transfer of the sample after the primary processing, and a secondary processing with respect to the sample are performed in the sample processing apparatus. The mounting surface 172A is orthogonal to the z axis.

Figure 10:
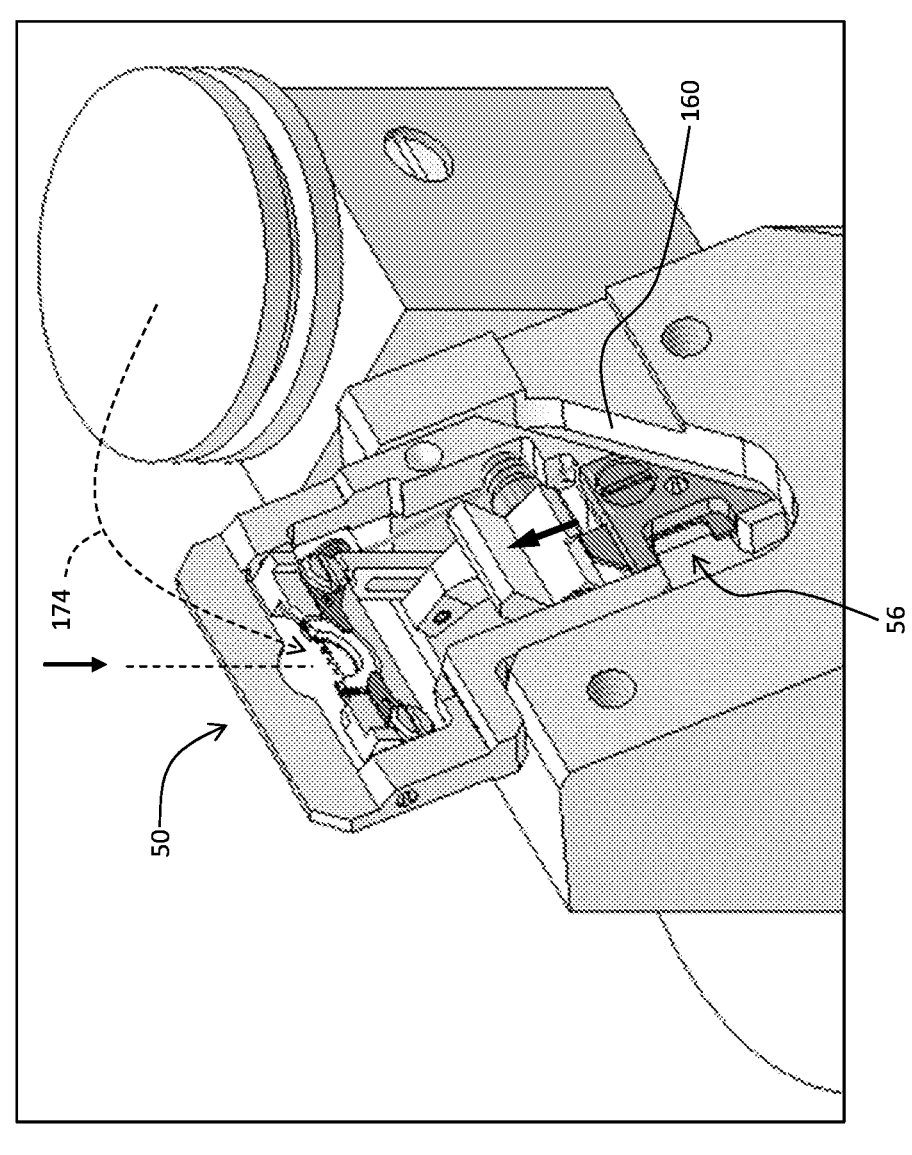
FIG. 10 is an enlarged perspective diagram showing a sample cartridge holding apparatus from which a cover member is removed.

In FIG. 10, illustration of the cover member is omitted. A portion to be housed of the sample cartridge 50 can be viewed through the side end surface of the cutout. The housing part 160 has a form to house the portion to be housed of the sample cartridge 50. A bottom surface of the sample cartridge 50 is mated with a bottom surface of the housing part 160. Reference numeral 174 schematically shows transfer of the sample after the primary processing. As shown in FIG. 10, in the attached state, a pressurizing force is exerted from the contact portion on the lever (refer to the arrow).

Figure 11:
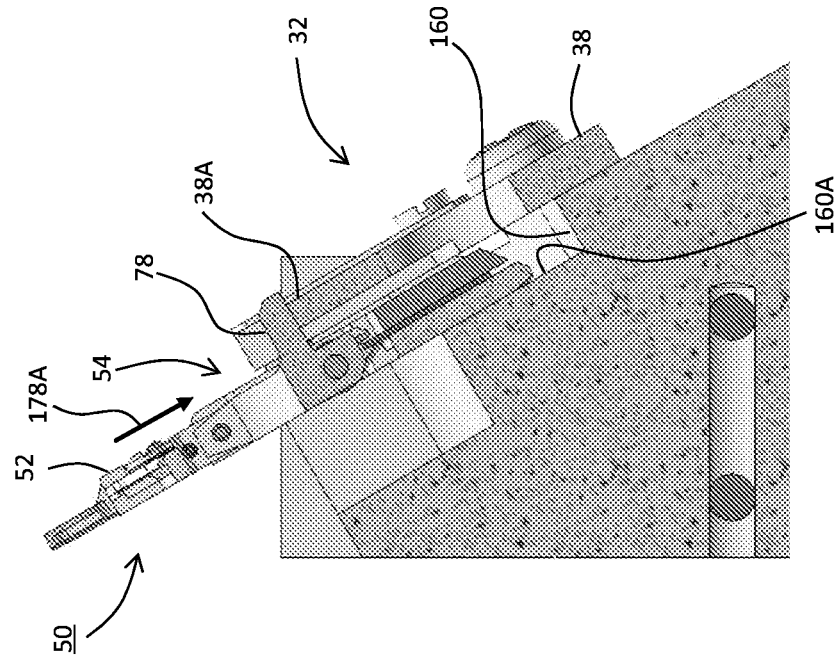
FIG. 11 is a cross-sectional diagram showing an initial state during insertion.

An operation during insertion of the sample cartridge will now be described with reference to FIGS. 11 to 13. FIG. 11 shows an initial state. Reference numeral 178A shows an insertion operation. The sample cartridge 50 is inserted along a bottom surface 160A of the housing part 160. In the initial state, the sample stand 52 is not inclined on the sample cartridge 50, and maintains the horizontal orientation (inclination angle of 0). The contact portion 38A contacts the lever 78, but the lever 78 has not yet started the rotational motion.

Figure 12:
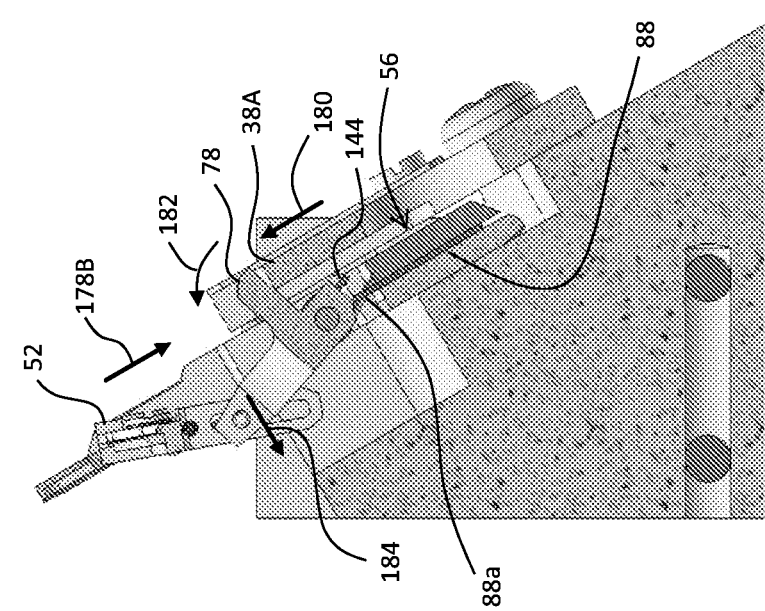
FIG. 12 is a cross-sectional diagram showing a starting state of an inclining motion during insertion.

FIG. 12 shows an intermediate state. With progress of an insertion motion 178B of the sample cartridge, a pressurizing force 180 is exerted from the contact portion 38A on the lever 78, and a rotational motion 182 of the lever 78 is caused. Ends of two arms moves in a direction shown by reference numeral 184. With this process, the sample stand 52 is inclined. In the rotation-prevention mechanism 56, the acting end 88a of the rotation plate 88 is inserted into the lower side of the protrusion 144 provided on the lever 78. In this state, the rotational motion of the lever 78 in the positive direction is restricted, but the rotational motion of the lever 78 in the negative direction is permitted.

Figure 13:
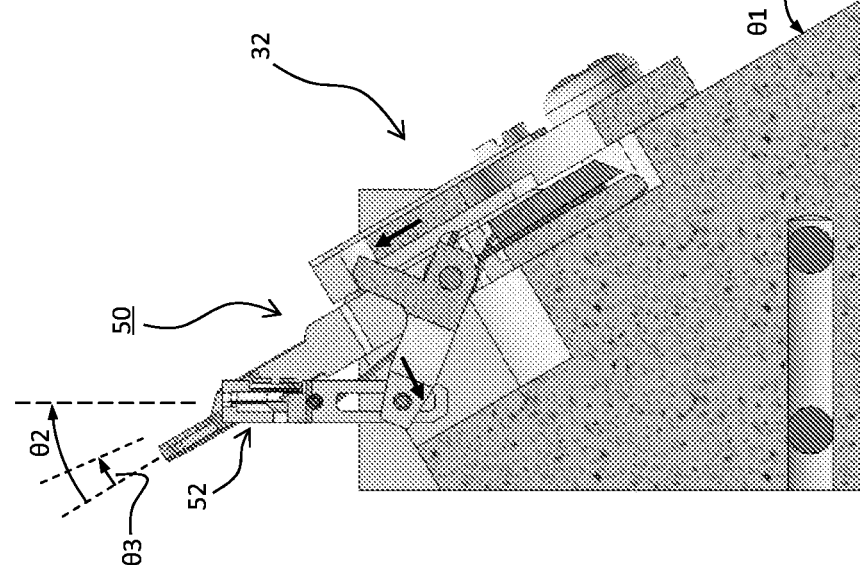
FIG. 13 is a cross-sectional diagram showing a completed state of the inclining motion (attached state) during insertion.

FIG. 13 shows an insertion completed state, that is, the attached state. The sample stand 52 is inclined with respect to the sample cartridge 50. The inclination angle is θ2. The inclination angle (inclination angle of the sample cartridge 50) θ1 of the housing part in the body and the inclination angle θ2 of the sample stand 52 on the sample cartridge 50 are in a cancelling-out relationship, and the front end surface of the support plate is orthogonal to the z direction. Alternatively, as described above, the inclination angle (predetermined angle) of the sample stand 52 in the attached state may be set to the angle θ3 smaller than the angle θ2. An alternative configuration may be considered in which an angle greater than the angle θ2 is taken as the predetermined angle.

Figure 14:
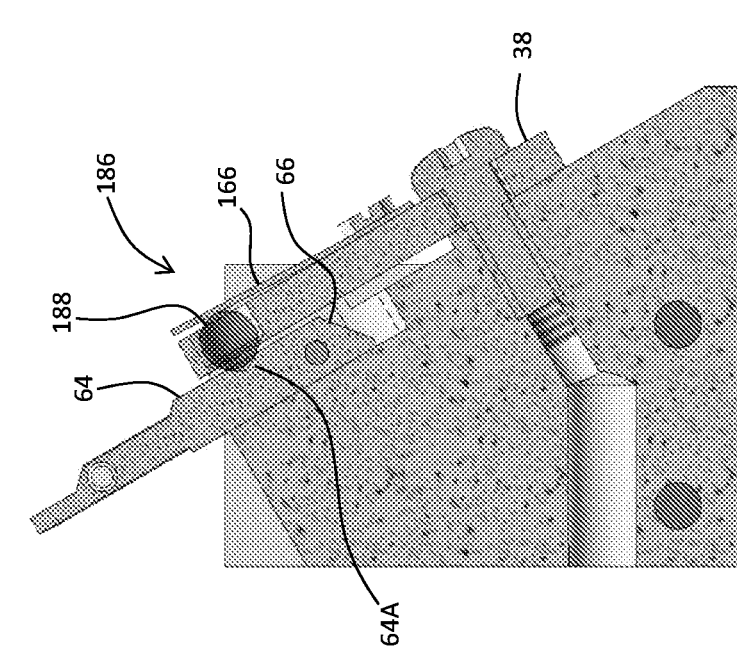
FIG. 14 is a cross-sectional diagram showing a structure and an action of a capturing mechanism.

FIG. 14 shows a captured state of the sample cartridge. A capturing mechanism 186 has a leaf spring 166, a ball 188, and the like. The recess 64A is formed on the side wall 64 in the sample cartridge. A ball chamber is formed in the cover member 38, and the ball 188 is housed in the ball chamber. An elastic force from the leaf spring 166 is exerted on the ball 188.

During insertion of the sample cartridge, the ball 188 rolls and moves upward on the inclined surface 66, rolls on the side wall 64, and falls into the recess 64A. With this process, the captured state is formed. When the sample cartridge is to be taken out, a withdrawal force exceeding the capturing force by the capturing mechanism 186 may be exerted on the sample cartridge. Alternatively, a mechanism other than the illustrated mechanism may be employed as the capturing mechanism 186.

According to the embodiment of the present disclosure described above, when the sample cartridge is attached to the sample cartridge holding apparatus, the sample stand is automatically inclined by the predetermined angle with respect to the sample cartridge. Thus, the frame (in particular, the reinforcement plate) of the sample cartridge does not interfere with the processing beam and the observation beam. That is, it becomes possible to appropriately perform sample processing, sample observation, and sample transfer.

Figure 15:
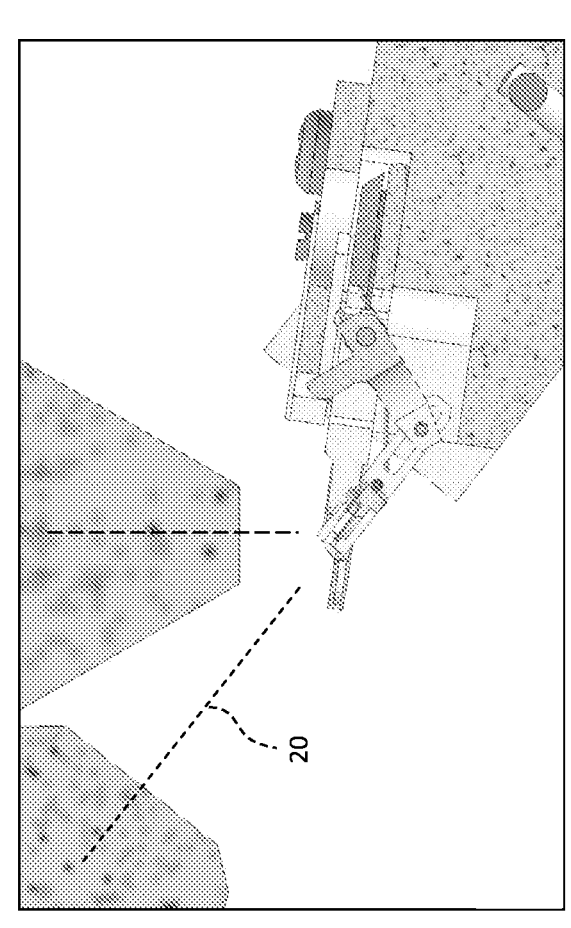
FIG. 15 is a diagram showing an example operation of a movable stage.

FIG. 15 shows an example operation during sample processing. With the function of the movable stage, the position and the orientation of the sample cartridge are changed. In the example illustrated in FIG. 15, an optical axis 20 for processing is orthogonal to the front end surface of the support plate.

Figure 16:
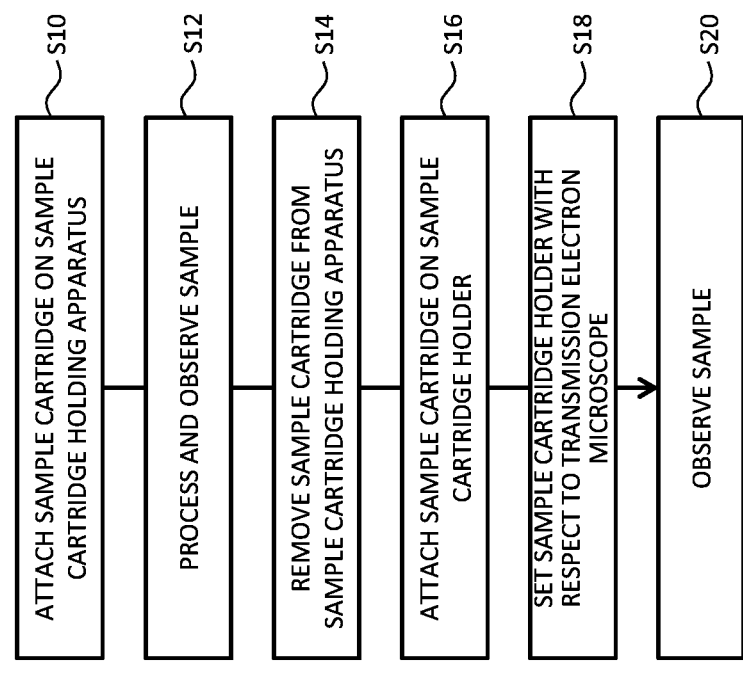
FIG. 16 is a diagram showing a processing and observing method according to an embodiment of the present disclosure.

FIG. 16 shows a sample processing and observing method according to an embodiment of the present disclosure. In S10, in a state in which the sample cartridge holding apparatus is mounted on the sample processing apparatus, the sample cartridge is attached to the sample cartridge holding apparatus. Alternatively, a configuration may be employed in which, after the sample cartridge is attached to the sample cartridge holding apparatus, the sample cartridge holding apparatus is mounted on the sample processing apparatus.

In S12, processing and observation of the sample are performed. More specifically, the primary processing is performed on the bulk sample mounted on the table, and then, the sample after the primary processing is transferred to the support plate. The sample is then secondarily processed, to thereby produce a sample for detailed observation. During the processing of the sample, the sample is observed with the scanning electron microscope as necessary.

In S14, after the sample is processed, the sample cartridge is taken out from the sample cartridge holding apparatus. In S16, the taken-out sample cartridge is attached to the sample cartridge holder. In this process, it is not necessary to take the support plate out from the sample cartridge.

In S18, the sample cartridge holder is attached to the transmission electron microscope. That is, the sample cartridge is placed in the transmission electron microscope. In S20, the sample is observed in detail with the transmission electron microscope. In this process, the orientation of the sample is changed as necessary.

According to the embodiment of the present disclosure described above, when the sample cartridge is inserted into the inclined housing part, the contact portion contacts the lever, and the inclining mechanism is caused to operate.

With this process, the inclination angle of the sample stand at the sample cartridge in the attached state is set to the appropriate angle. That is, a state is formed in which appropriate performance of the processing or the like of the sample is enabled. More specifically, even when the sample stand is surrounded by the frame in the sample cartridge, the frame does not become an obstruction during the processing or the observation of the sample. In other words, the strength and rigidity of the sample cartridge can be increased presuming the inclination of the sample stand in the attached state. Alternatively, an adjustment mechanism for adjusting the predetermined angle formed in the attached state may be provided. The adjustment mechanism adjusts the predetermined angle by changing a relative position of the contact portion with respect to the housing part. As the adjustment mechanism, there may be employed a slide mechanism which changes a position on the inclined surface of the body where the cover member is fixed. In the embodiment of the present disclosure described above, the sample may be processed by a beam other than the focused beam. Alternatively, the sample cartridge holding apparatus may be mounted on a sample observation apparatus.

The invention claimed is:

1. A sample cartridge holding apparatus comprising:
a body comprising a housing part into which a sample cartridge having a frame, a sample stand and an inclining mechanism is inserted; and
a contact portion fixed on the body, and configured to contact a lever, provided on the inclining mechanism, during insertion of the sample cartridge into the housing part, to thereby cause a motion of the lever, wherein
the sample stand is arranged to be inclinable in the frame,
the inclining mechanism converts the motion of the lever into an inclining motion of the sample stand, the inclining motion of the sample stand being a motion with respect to the frame, and
in an attached state in which the insertion of the sample cartridge into the housing part is completed, an inclination angle of the sample stand in the sample cartridge is set to a predetermined angle.

2. The sample cartridge holding apparatus according to claim 1, wherein
the predetermined angle is an angle other than 0 degree and which is lower than or equal to a maximum inclination angle.

3. The sample cartridge holding apparatus according to claim 1, wherein
a z axis which is parallel to a central axis of the body, an x axis which is orthogonal to the z axis, and a y axis which is orthogonal to the z axis and the x axis are defined with the body as a reference,
the housing part is inclined in the body,
an inclination angle of the housing part lies in a plane defined by the z axis and the x axis, and corresponds to a rotational angle in one direction about the y axis,
the inclination angle of the sample stand in the sample cartridge in the attached state lies in the plane, and corresponds to a rotational angle in the other direction about the y axis, and
the inclination angle of the housing part in the body and the inclination angle of the sample stand in the sample cartridge are in a relationship to totally or partially cancel each other out.

4. The sample cartridge holding apparatus according to claim 1, wherein on the body, a cutout is formed which has a front surface opening orthogonal to a direction of insertion of the sample cartridge, and a side surface opening parallel to the direction of insertion, the side surface opening is covered with a cover member, so as to form the housing part, and a part of the cover member is the contact portion.

5. The sample cartridge holding apparatus according to claim 4, wherein the housing part is inclined in the body, the body has an inclined surface onto which the cover member is attached, and an inclination angle of the inclined surface is equal to the inclination angle of the housing part.

6. The sample cartridge holding apparatus according to claim 4, wherein the cover member has an opening for partially exposing a portion to be housed of the sample cartridge.

7. The sample cartridge holding apparatus according to claim 6, wherein the inclining mechanism has an elastic member which exerts a rotational force in one direction on the sample stand, the contact portion contacts the lever to thereby cause the sample stand to rotate in the other direction, the sample cartridge has a restriction mechanism which restricts a rotational motion of the sample stand in the one direction, the portion to be housed includes a manipulation portion for manipulating an operation of the restriction mechanism, and the manipulation portion is exposed through the opening.

8. The sample cartridge holding apparatus according to claim 1, further comprising:

a capturing mechanism that captures the sample cartridge inserted into the housing part.

9. The sample cartridge holding apparatus according to claim 8, wherein the capturing mechanism comprises:

a ball which enters a recess formed on the sample cartridge; and a spring which exerts, on the ball, an elastic force toward the sample cartridge.

10. The sample cartridge holding apparatus according to claim 1, wherein the sample cartridge holding apparatus is mounted on a movable stage provided on an apparatus which performs processing and observation of a sample.

\* \* \* \* \*